United States Patent
Nishida

(10) Patent No.: US 8,830,005 B2
(45) Date of Patent: *Sep. 9, 2014

(54) OPTICAL MODULE FOR ATOMIC OSCILLATOR AND ATOMIC OSCILLATOR

(75) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/359,830

(22) Filed: Jan. 27, 2012

(65) Prior Publication Data

US 2012/0242417 A1 Sep. 27, 2012

(30) Foreign Application Priority Data

Mar. 23, 2011 (JP) .................. 2011-064031

(51) Int. Cl.
- H03B 17/00 (2006.01)
- G04F 5/14 (2006.01)
- H03L 7/26 (2006.01)

(52) U.S. Cl.
CPC . *H03L 7/26* (2013.01); *G04F 5/145* (2013.01)
USPC .............................. 331/94.1; 331/3

(58) Field of Classification Search
USPC .................... 331/94.1, 3; 372/26, 31, 32, 106
See application file for complete search history.

(56) References Cited

U.S. PATENT DOCUMENTS

| | | | |
|---|---|---|---|
| 3,546,622 A | 12/1970 | Amnon et al. | |
| 3,720,882 A | 3/1973 | Tang et al. | |
| 4,733,397 A | 3/1988 | Gallagher et al. | |
| 6,201,821 B1 | 3/2001 | Zhu et al. | |
| 6,363,091 B1 | 3/2002 | Zhu et al. | |
| 6,570,459 B1 | 5/2003 | Nathanson et al. | |
| 6,806,784 B2 | 10/2004 | Hollberg et al. | |
| 6,900,702 B2 | 5/2005 | Youngner et al. | |
| 6,993,058 B2 * | 1/2006 | Zhu ............................ | 372/106 |
| 7,098,744 B2 | 8/2006 | Hayes | |
| 7,378,913 B2 | 5/2008 | Laiacano et al. | |
| 8,237,514 B2 | 8/2012 | Aoyama et al. | |
| 8,314,661 B2 | 11/2012 | Chindo | |

(Continued)

FOREIGN PATENT DOCUMENTS

| | | |
|---|---|---|
| EP | 1 473 605 A2 | 11/2004 |
| JP | 2007-336136 | 12/2007 |

(Continued)

OTHER PUBLICATIONS

Extended European Search Report for Application No. EP 11 17 3564 dated Nov. 15, 2011 (5 pages).

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

An optical module for an atomic oscillator uses a quantum interference effect. The optical module includes a light source adapted to emit light including a fundamental wave having a center wavelength, and sideband waves of the fundamental wave, a wavelength selection section receiving the light from the light source, and adapted to transmit the sideband waves out of the light input, a gas cell encapsulating an alkali metal gas, and irradiated with light transmitted through the wavelength selection section, and a light detection section adapted to detect an intensity of light transmitted through the gas cell. The wavelength selection section includes an etalon and a temperature control section adapted to control temperature of the etalon.

8 Claims, 5 Drawing Sheets

(56) References Cited

U.S. PATENT DOCUMENTS

| | | |
|---|---|---|
| 2002/0163394 A1 | 11/2002 | Hollberg et al. |
| 2005/0073690 A1* | 4/2005 | Abbink et al. ............... 356/451 |
| 2007/0258673 A1 | 11/2007 | El-Sherif |
| 2009/0175621 A1* | 7/2009 | Kobayashi et al. ............. 398/77 |
| 2011/0274127 A1* | 11/2011 | Masuda et al. .................. 372/25 |
| 2012/0013411 A1 | 1/2012 | Nishida |
| 2012/0235752 A1 | 9/2012 | Nishida |
| 2012/0235753 A1* | 9/2012 | Nishida ....................... 331/94.1 |
| 2012/0242417 A1 | 9/2012 | Nishida |
| 2013/0265113 A1 | 10/2013 | Nishida |

FOREIGN PATENT DOCUMENTS

| | | |
|---|---|---|
| JP | 2009-089116 | 4/2009 |
| JP | 2009-164331 | 7/2009 |
| JP | 2009-188598 | 8/2009 |
| JP | 2012-023179 A | 2/2012 |

* cited by examiner

OPTICAL MODULE FOR ATOMIC OSCILLATOR AND ATOMIC OSCILLATOR

BACKGROUND

1. Technical Field

The present invention relates to an optical module for an atomic oscillator and an atomic oscillator.

2. Related art

In recent years, an atomic oscillator using CPT (Coherent Population Trapping) as one of quantum interference effects is proposed, and miniaturization of an apparatus and reduction in power consumption are expected. The atomic oscillator using the CPT is the oscillator using a phenomenon (EIT phenomenon: Electromagnetically Induced Transparency) in which when two resonant lights having wavelengths (frequencies) different from each other are simultaneously irradiated to an alkali metal atom, the absorption of the two resonant lights is stopped. For example, JP-A-2009-89116 (patent document 1) discloses an atomic oscillator using CPT, which includes an optical module including a light source to emit coherent light, a gas cell in which alkali metal atoms are enclosed, and a light-receiving element to detect the intensity of light passing through the gas cell.

In the atomic oscillator using the CPT, for example, a semiconductor laser is used as a light source. In the atomic oscillator using the semiconductor laser as the light source, for example, the drive current of the semiconductor laser is modulated so that a sideband wave is generated in the light emitted from the semiconductor laser and the EIT phenomenon is caused.

However, the light emitted from the semiconductor laser in which the drive current is modulated includes not only the sideband wave but also a fundamental wave (carrier wave) which does not contribute to the EIT phenomenon and has a center wavelength. When the fundamental wave is irradiated to the alkali metal atom, there is a case where the wavelength (frequency) of light absorbed by the alkali metal atom is changed (AC Stark effect), and the stability of frequency of the atomic oscillator is reduced.

SUMMARY

An advantage of some aspects of the invention is to provide an optical module for an atomic oscillator, which can obtain the atomic oscillator having high frequency stability. Another advantage of some aspects of the invention is to provide an atomic oscillator including the optical module.

APPLICATION EXAMPLE 1

This application example of the invention is directed to an optical module for an atomic oscillator is an optical module for an atomic oscillator using a quantum interference effect. The optical module includes a light source adapted to emit light including a fundamental wave having a center wavelength, and sideband waves of the fundamental wave, a wavelength selection section receiving the light from the light source, and adapted to transmit the sideband waves out of the light input, a gas cell encapsulating an alkali metal gas, and irradiated with light transmitted through the wavelength selection section, and a light detection section adapted to detect an intensity of light transmitted through the gas cell. The wavelength selection section includes an etalon and a temperature control section adapted to control temperature of the etalon.

According to this application example of the invention, the optical module is used for the atomic oscillator using the quantum interference effect. The optical module includes the light source, the wavelength selection section, the gas cell and the light detection section. The light source emits the first light including the fundamental wave having the center wavelength, and the sideband waves of the fundamental wave. The wavelength selection section selects the sideband waves from the light from the light source. The wavelength selection section includes the etalon and the temperature control section to control the temperature of the etalon. The alkali metal gas is encapsulated by the gas cell and the light transmitted through the wavelength selection section is irradiated to the gas cell. The light detection section detects the intensity of the light transmitted through the gas cell.

Since the wavelength selection section selects the sideband waves from the light from the light source, the intensity of the fundamental wave can be reduced or the fundamental wave can be eliminated. This can suppress or prevent the fundamental wave, which does not contribute to the EIT phenomenon, from being irradiated to the alkali metal atom. Accordingly, a frequency change due to the AC Stark effect can be suppressed, and the atomic oscillator having high frequency stability can be provided.

Further, since the wavelength selection section includes the temperature control section to control the temperature of the etalon, the wavelength selection section can change the wavelength selection characteristic (wavelength range selected by the etalon) of the etalon by a thermooptical effect. By this, the wavelength selection section can correct a shift in the wavelength selection characteristic of the etalon due to a manufacture error, an environmental change or the like, and can accurately select and emit the sideband waves from the light from the light source. As a result, the atomic oscillator having high frequency stability can be provided.

APPLICATION EXAMPLE 2

It is preferable that in the optical module for an atomic oscillator, the temperature control section includes a resistive element, and controls the temperature of the etalon by controlling a current to be applied to the resistive element.

According to the optical module as stated above, the wavelength selection section includes the resistive element. The temperature of the etalon is controlled by controlling the current to be applied to the resistive element. Accordingly, the wavelength can be selected by the simple structure.

APPLICATION EXAMPLE 3

It is preferable that in the optical module for an atomic oscillator, the light source is a surface emitting laser.

According to the optical module as stated above, the light source is the surface emitting laser. Accordingly, as compared with a case where the light source is an end-face emitting laser, a current for obtaining a gain can be reduced. As a result, the power consumption of the optical module can be reduced.

APPLICATION EXAMPLE 4

It is preferable that the optical module for an atomic oscillator further includes an optical element adapted to make the light emitted from the light source enter the etalon.

According to the optical module as stated above, the light emitted from the light source can be efficiently guided to the etalon. Accordingly, the light can be efficiently used.

APPLICATION EXAMPLE 5

This application example of the invention is directed to an atomic oscillator including the optical module for an atomic oscillator according to the application example of the invention and a frequency control circuit.

The atomic oscillator as stated above includes the optical module for the atomic oscillator according to the application example of the invention. Accordingly, the atomic oscillator can suppress the frequency variation due to the AC Stark effect and can raise the frequency stability.

BRIEF DESCRIPTION OF THE DRAWINGS

The invention will be described with reference to accompanying drawings, where in like numbers reference like elements.

DESCRIPTION OF EXEMPLARY EMBODIMENTS

Hereinafter, exemplary embodiments of the invention will be described with reference to the drawings. Incidentally, in the following respective drawings, scales of respective members are made different from actual ones so that sizes of the respective members are large enough to be recognizable.

Figure 1:
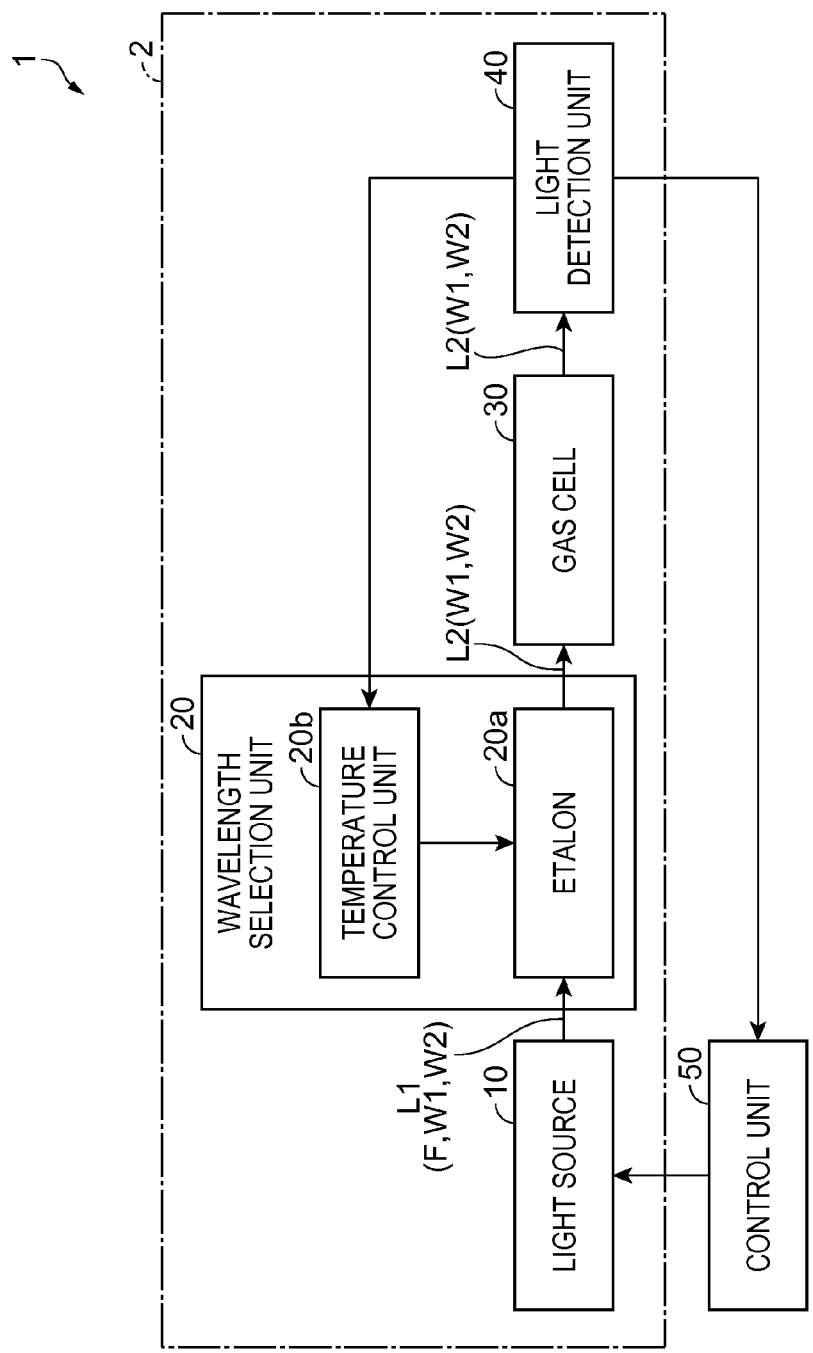
FIG. 1 is a block diagram showing a function of an atomic oscillator of an embodiment.

FIG. 1 is a block diagram showing a function of an atomic oscillator of an embodiment. First, an optical module and the atomic oscillator of the embodiment will be described. An atomic oscillator 1 is an oscillator using an quantum interference effect, and the atomic oscillator 1 includes an optical module 2 and a control unit (a control section) 50.

In the optical module 2, a light source 10, a wavelength selection unit (a wavelength selection section) 20, a gas cell 30 and a light detection unit (a light detection section) 40 are connected in this order. The light source 10 generates a first light L1 including a fundamental wave F having a center wavelength (center frequency), and a first sideband wave W1 and a second sideband wave W2 having wavelengths different from each other.

The wavelength selection unit 20 selects the first sideband wave W1 and the second sideband wave W2 from the first light L1, and emits them as a second light L2. The wavelength selection unit 20 includes an etalon 20a to select and emit alight within a specified wavelength range, and a temperature control unit (a temperature control section) 20b to control the temperature of the etalon 20a. The temperature control unit 20b can change the wavelength range (wavelength selection characteristic) selected by the etalon 20a by controlling the temperature of the etalon 20a.

An alkali metal gas is encapsulated by the gas cell 30, and the second light L2 is irradiated to the gas cell 30. The light detection unit 40 detects the intensity of the second light L2 passing (transmitted) through the gas cell 30.

The control unit 50 controls, based on the detection result of the light detection unit 40, so that a difference between frequencies of the first sideband wave W1 and the second sideband wave W2 is equal to a frequency corresponding to an energy difference between two ground levels of the alkali metal atom enclosed in the gas cell 30. The control unit 50 generates a detection signal having a modulation frequency $f_m$ based on the detection result of the light detection unit 40. The light source 10 modulates the fundamental wave F having a specified frequency $f_0$ based on this detection signal, and generates the first sideband wave W1 having a frequency $f_1 = f_0 + f_m$ and the second sideband wave W2 having a frequency $f_2 = f_0 - f_m$.

Figure 2A:
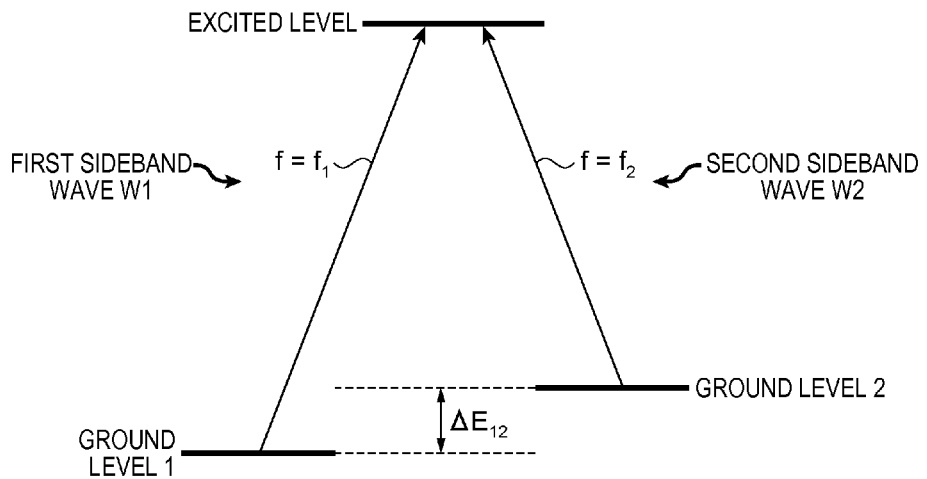
FIG. 2A is a view for explaining a Λ-type three-level model of an alkali metal atom and a relation between a first sideband wave and a second sideband wave.
Figure 2B:
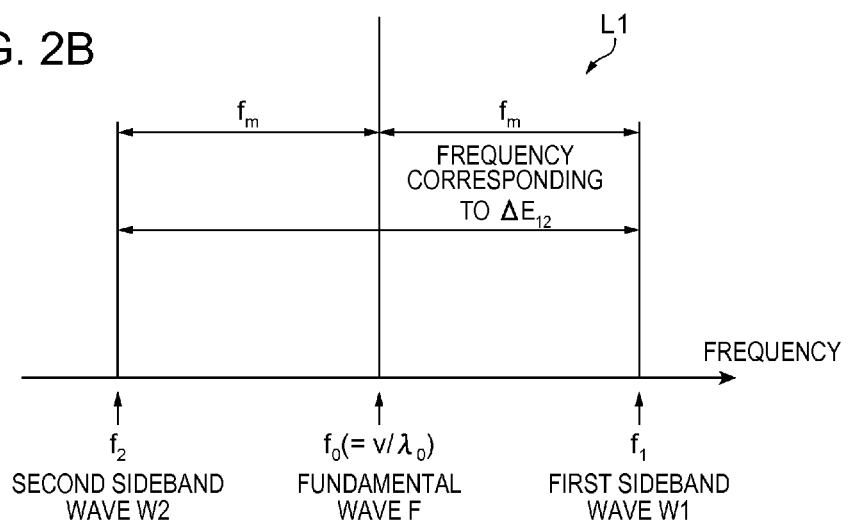
FIG. 2B is a view for explaining a frequency spectrum of a first light generated by a light source.

FIG. 2A is a view for explaining a Λ-type three-level model of the alkali metal and a relation between the first sideband wave and the second sideband wave. FIG. 2B is a view for explaining a frequency spectrum of the first light generated by the light source.

As shown in FIG. 2B, the first light L1 generated by the light source 10 includes the fundamental wave F having the center frequency $f_0$ (=$v/\lambda_0$: v is speed of light, $\lambda_0$ is the center wavelength of the laser light), the first sideband wave W1 having the frequency $f_1$ in an upper sideband with respect to the center frequency $f_0$, and the second sideband wave W2 having the frequency $f_2$ in a lower sideband with respect to the center frequency $f_0$. The frequency $f_1$ of the first sideband wave W1 is $f_1 = f_0 + f_m$, and the frequency $f_2$ of the second sideband wave W2 is $f_2 = f_0 - f_m$.

As shown in FIG. 2A and FIG. 2B, the frequency difference between the frequency $f_1$ of the first sideband wave W1 and the frequency $f_2$ of the second sideband wave W2 coincides with the frequency corresponding to the energy difference $\Delta E_{12}$ between the ground level 1 and the ground level 2 of the alkali metal atom. Accordingly, the alkali metal atom causes the EIT phenomenon by the first sideband wave W1 having the frequency $f_1$ and the second sideband wave W2 having the frequency $f_2$.

Here, the EIT phenomenon will be described. It is known that the interaction between the alkali metal atom and light can be explained in the Λ-type three-level system model. As shown in FIG. 2A, the alkali metal atom has two ground levels, and when the first sideband wave W1 having the wavelength (frequency $f_1$) corresponding to the energy difference between the ground level 1 and the excited level or the second sideband wave W2 having the wavelength (frequency $f_2$) corresponding to the energy difference between the ground level 2 and the excited level is individually irradiated to the alkali metal atom, light absorption occurs. However, as shown in FIG. 2B, when the first sideband wave W1 and the second sideband wave W2 in which the frequency difference $f_1 - f_2$ accurately coincides with the frequency corresponding to the energy difference $\Delta E_{12}$ between the ground level 1 and the ground level 2 are simultaneously irradiated to the alkali metal atom, a superimposed state of the two ground levels, that is, a quantum interference state occurs, the excitation to the excited level is stopped, and the transparency phenomenon (EIT phenomenon) occurs in which the first sideband wave W1 and the second sideband wave W2 pass through the alkali metal atom. A highly accurate oscillator can be realized by using the FIT phenomenon and by detecting the abrupt change of the light absorption behavior when the frequency difference $f_1 - f_2$ between the first sideband wave W1 and the second sideband wave W2 is shifted from the frequency corresponding to the energy difference $\Delta E_{12}$ between the ground level 1 and the ground level 2.

Figure 3:
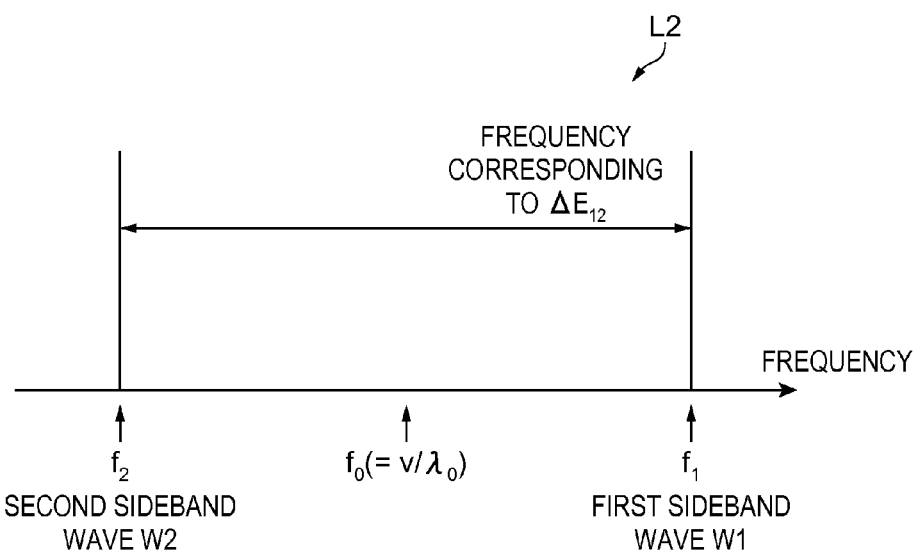
FIG. 3 is a view for explaining a frequency spectrum of a second light emitted from a wavelength selection unit.

FIG. 3 is a view for explaining a frequency spectrum of the second light emitted from the wavelength selection unit. As compared with the first light L1, the second light L2 is the light in which the fundamental wave F is eliminated or the intensity of the fundamental wave F is reduced. As shown in FIG. 3, the second light L2 includes only the first sideband wave W1 having the frequency $f_1$ in the upper sideband with respect to the center frequency $f_0$ and the second sideband wave W2 having the frequency $f_2$ in the lower sideband with respect to the center frequency $f_0$. As stated above, in the optical module 2, the intensity of the fundamental wave F can be reduced or the fundamental wave F can be eliminated by the wavelength selection unit 20.

Figure 4:
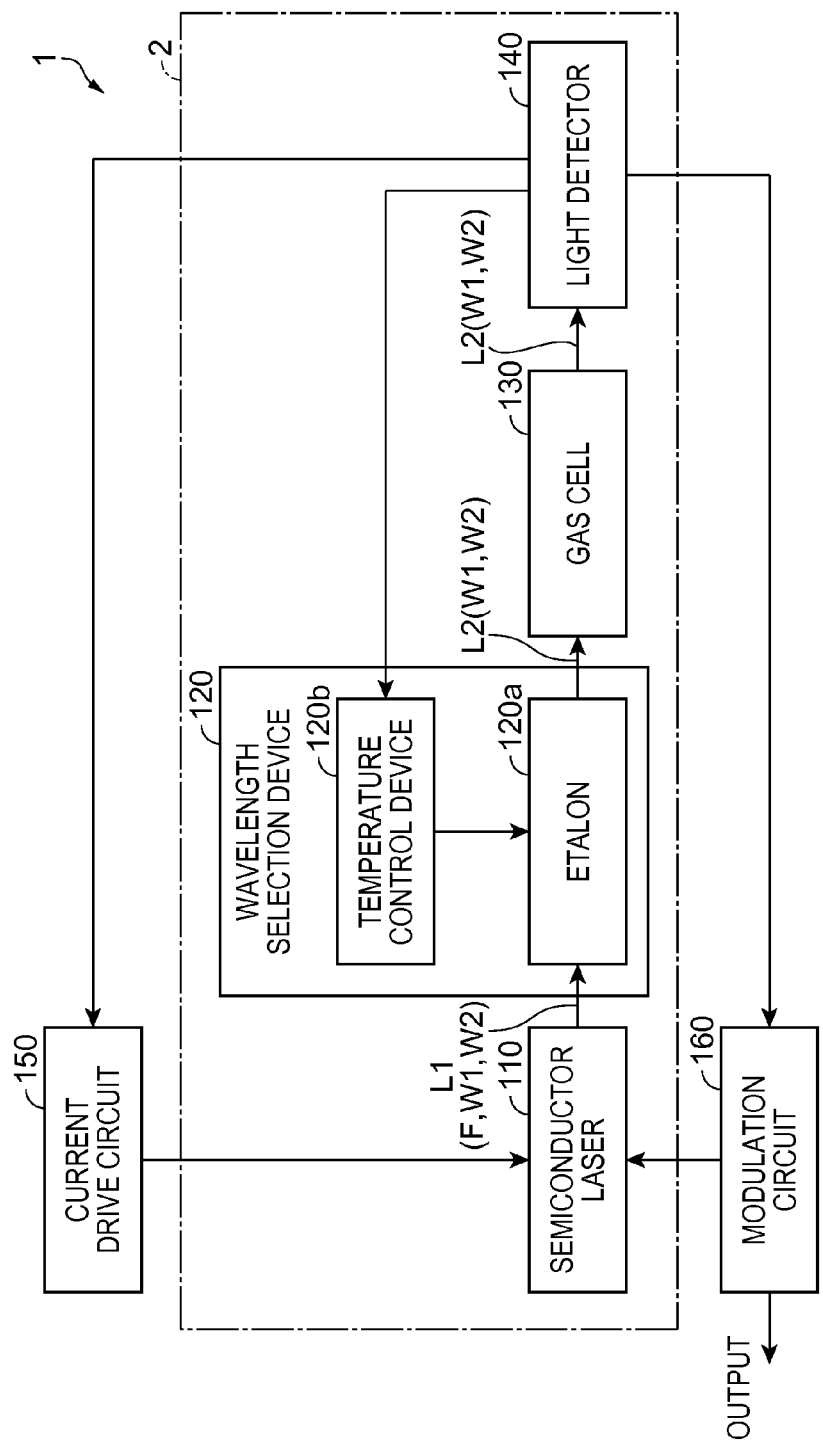
FIG. 4 is a block diagram showing a structure of the atomic oscillator.

Next, a more specific structure of the atomic oscillator 1 will be described. FIG. 4 is a block diagram showing the structure of the atomic oscillator. As shown in FIG. 4, the atomic oscillator 1 includes the optical module 2, a current drive circuit 150 and a modulation circuit 160.

In the optical module 2, a semiconductor laser 110, a wavelength selection device 120, a gas cell 130 and a light detector 140 are connected in this order.

The semiconductor laser 110 generates the first light L1 including the fundamental wave F having the center wavelength, and the first sideband wave W1 and the second sideband wave W2 having wavelengths different from each other. The center frequency $f_0$ (center wavelength $\lambda_0$) of the laser light (first light L1) emitted by the semiconductor laser 110 is controlled by a drive current outputted by the current drive circuit 150, and the laser light is modulated by an output signal (modulation signal) of the modulation circuit 160. That is, an AC current having a frequency component of the modulation signal is superimposed on the drive current of the current drive circuit 150, so that the first light L1 emitted by the semiconductor laser 110 can be modulated. By this, the first sideband wave W1 and the second sideband wave W2 are generated in the first light L1. Since the light generated by the semiconductor laser 110 has coherency, the light is suitable for obtaining the quantum interference effect.

As shown in FIG. 2B, the first light L1 includes the fundamental wave F having the center frequency $f_0$ (=v/$\lambda_0$: v is speed of light, $\lambda_0$ is the center frequency of the first light L1), the first sideband wave W1 having the frequency $f_1$ in the upper sideband with respect to the center frequency $f_0$, and the second sideband wave W2 having the frequency $f_2$ in the lower sideband with respect to the center frequency $f_0$. The frequency $f_1$ of the first sideband wave W1 is $f_1=f_0+f_m$, and the frequency $f_2$ of the second sideband wave W2 is $f_2=f_0-f_m$.

Return is made to FIG. 4. The wavelength selection device 120 selects the first sideband wave W1 and the second sideband wave W2 from the first light L1, and emits them as the second light L2. The wavelength selection device 120 includes an etalon 120a to select and emit light within a specified wavelength range, and a temperature control device 120b as a temperature control unit to control the temperature of the etalon 120a.

The etalon 120a can select and emit the first sideband wave W1 and the second sideband wave W2 from the first light L1. By this, the intensity of the fundamental wave F of the first light L1 incident on the etalon 120a is reduced or the fundamental wave F is eliminated, and the second light L2 can be emitted. That is, as compared with the first light L1, in the second light L2, the intensity of the fundamental wave F is reduced or the fundamental wave F is eliminated. In the example of FIG. 3, the second light L2 includes only the first sideband wave W1 and the second sideband wave W2.

The temperature control device 120b can change the wavelength range (wavelength selection characteristic) selected by the etalon 120a by a thermooptical effect. Here, the thermooptical effect is a phenomenon in which the refractive index of a material for light is changed by application of heat from the outside. Specifically, the temperature control device 120b controls the temperature of the etalon 120a to change the refractive index of the etalon 120a, and controls the wavelength selection characteristic of the etalon 120a. Since the wavelength selection device 120 can correct the shift of the wavelength selection characteristic of the etalon 120a due to a manufacture error or environmental change (heat, light, etc.) by the temperature control device 120b, the wavelength selection device can accurately select and emit the first sideband wave W1 and the second sideband wave W2 from the first light L1.

The temperature control device 120b may adjust the temperature of the etalon 120a based on the output signal of the light detector 140 and may control the wavelength characteristic of the etalon 120a. In the optical module 2, the temperature of the etalon 120a is adjusted by, for example, a feedback loop passing through the etalon 120a, the gas cell 130, the light detector 140 and the temperature control device 120b, and the wavelength selection characteristic of the etalon 120a is controlled.

Besides, the temperature control device 120b may adjust the temperature of the etalon 120a based on the previously obtained data of the shift of the wavelength selection characteristic of the etalon 120a and may correct the shift of the wavelength characteristic of the etalon 120a.

The gas cell 130 is such that a gaseous alkali metal atom (sodium (Na) atom, rubidium (Rb) atom, cesium (Cs) atom, etc.) is enclosed in a container. The gas cell 130 is irradiated with the second light L2 emitted from the wavelength selection device 120.

When the gas cell 130 is irradiated with two light waves (the first sideband wave and the second sideband wave) having the frequency (wavelength) difference corresponding to the energy difference between the two ground levels of the alkali metal atom, the alkali metal atom causes the EIT phenomenon. For example, when the alkali metal atom is a cesium atom, since the frequency corresponding to the energy difference between the ground level 1 and the ground level 2 of the D1 line (one of Fraunhofer lines) is 9.19263 ••• GHz, when two light waves having a frequency difference of 9.19263 ••• GHz are irradiated, the EIT phenomenon occurs.

The light detector 140 detects the second light L2 passing through the gas cell 130, and outputs a signal having a signal intensity corresponding to the amount of detected light. The output signal of the light detector 140 is inputted to the current drive circuit 150 and the modulation circuit 160. Besides, the output signal of light detector 140 may be further inputted to the temperature control device 120b. The light detector 140 is not particularly limited, and for example, a photodiode can be used.

The current drive circuit 150 generates the drive current having the magnitude corresponding to the output signal of the light detector 140, and supplies the drive current to the semiconductor laser 110 to control the center frequency $f_0$ (center wavelength $\lambda_0$) of the first light L1. The center frequency $f_0$ (center wavelength $\lambda_0$) of the first light L1 is finely adjusted by a feedback loop passing through the semiconductor laser 110, the wavelength selection device 120, the gas cell 130, the light detector 140 and the current drive circuit 150 and is stabilized.

The modulation circuit 160 generates the modulation signal having the modulation frequency $f_m$ according to the output signal of the light detector 140. The modulation signal is supplied to the semiconductor laser 110 while the modulation frequency $f_m$ is finely adjusted so that the output signal of the light detector 140 becomes maximum. The laser light emitted by the semiconductor laser 110 is modulated by the modulation signal, and the first sideband wave W1 and the second sideband wave W2 are generated.

Incidentally, the semiconductor laser 110, the wavelength selection device 120, the gas cell 130 and the light detector 140 respectively correspond to the light source 10, the wavelength selection unit 20, the gas cell 30 and the light detection unit 40 of FIG. 1. Besides, the etalon 120a corresponds to the etalon 20a of FIG. 1, and the temperature control device 120b corresponds to the temperature control unit 20b of FIG. 1. Besides, the current drive circuit 150 and the modulation circuit 160 correspond to the control unit 50 of FIG. 1.

In the atomic oscillator 1 having the structure as stated above, the semiconductor laser 110 generates the first light L1 having the first sideband wave W1 and the second sideband wave W2. Unless the frequency difference between the first sideband wave W1 and the second sideband wave W2 accurately coincides with the frequency corresponding to the energy difference between the two ground levels of the alkali metal atom contained in the gas cell 130, the alkali metal atom does not cause the EIT phenomenon. Thus, the detection amount of the light detector 140 changes very sensitively according to the frequencies of the first sideband wave W1 and the second sideband wave W2. Thus, the control of the feedback loop passing through the semiconductor laser 110, the wavelength selection device 120, the gas cell 130, the light detector 140 and the modulation circuit 160 is performed. By this control, the frequency difference between the first sideband wave W1 and the second sideband wave W2 can be very accurately made to coincide with the frequency corresponding to the energy difference between the two ground levels of the alkali metal atom. As a result, since the modulation frequency becomes a very stable frequency, the modulation signal can be made the output signal (clock signal) of the atomic oscillator 1.

Figure 5:
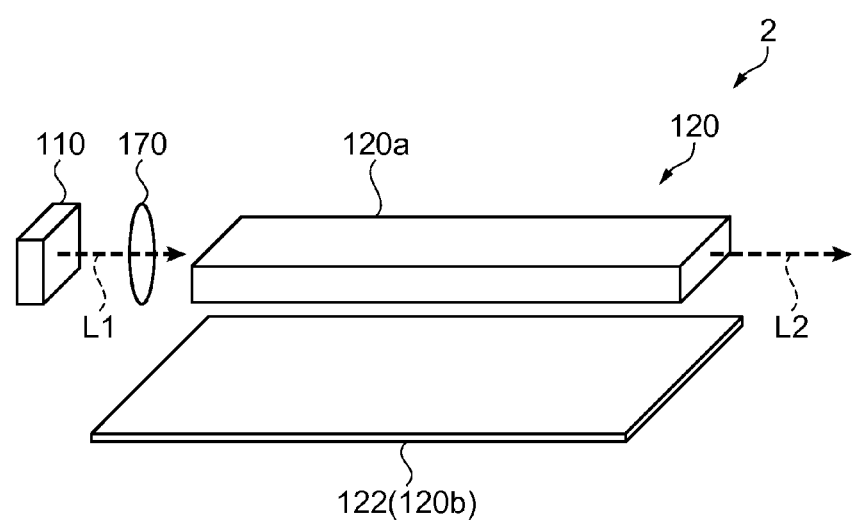
FIG. 5 is a schematic perspective view showing a main part of an optical module.

FIG. 5 is a schematic perspective view showing a main part of the optical module. As shown in FIG. 5, the optical module 2 includes the semiconductor laser 110 and the wavelength selection device 120. As the semiconductor laser 10, for example, a surface emitting laser can be used. As compared with an end-face emitting laser, in the surface emitting laser, since a current for obtaining a gain is small, power consumption can be reduced. Incidentally, as the semiconductor laser 110, the end-face emitting laser may be used. The first light L1 emitted from the semiconductor laser 110 is condensed by an optical element 170 and is incident on the etalon 120a. In the illustrated example, the optical element 170 is a lens that condenses the first light L1 emitted from the semiconductor laser 110 and causes the light to be incident on the etalon 120a.

The etalon 120a selects the first sideband wave W1 and the second sideband wave W2 of the first light and allows them to pass through. That is, the etalon 120a has a large transmittance for the first sideband wave W1 and the second sideband wave W2, and has a small transmittance for the fundamental wave F. By this, the intensity of the fundamental wave F of the first light L1 incident on the etalon 120a is reduced or the fundamental wave F is eliminated, and the second light L2 can be emitted. That is, as compared with the first light L1, in the second light L2, the intensity of the fundamental wave F is reduced or the fundamental wave F is eliminated. By this, the second light L2 becomes as shown in the example shown in FIG. 3. That is, the second light L2 includes only the first sideband wave W1 having the frequency $f_1$ in the upper sideband with respect to the center frequency $f_0$, and the second sideband wave W2 having the frequency $f_2$ in the lower sideband with respect to the center frequency $f_0$.

Return is made to FIG. 5. The etalon 120a is disposed above a heating element 122 of the temperature control device 120b. Incidentally, the positional relation between the etalon 120a and the heating element 122 of the temperature control device 120b is not particularly limited. The etalon 120a selects the first sideband wave W1 and the second sideband wave W2 from the incident first light L1 and can allow them to pass through.

The temperature control device 120b includes the heating element 122 for supplying heat to the etalon 120a. When the temperature of the etalon 120a is changed by the heat supplied from the temperature control device 120b, the thermooptical effect occurs, the refractive index of the etalon 120a is changed, and the wavelength selection characteristic (wavelength range selected by the etalon) of the etalon 120a is changed. The heating element 122 is, for example, a resistor (a resistive element) that generates heat by current flow. The temperature control device 120b controls the amount of current flowing through the heating element 122 (resistor) to adjust the temperature of the heating element 122, and can control the temperature of the etalon 120a. Incidentally, the temperature control device 120 has only to be capable of controlling the temperature of the etalon 120a, and is not particularly limited, and a heat generating device such as a well-known hot plate may be used.

As described above, according to the optical module 2 and the atomic oscillator 1 of the embodiment, the following effects can be obtained.

(1) According to the embodiment, the wavelength selection device 120 can reduce the intensity of the fundamental wave F of the first light L1 or can eliminate the fundamental wave F. This can suppress or prevent the fundamental wave F, which does not contribute to the EIT phenomenon, from being irradiated to the metal atom. Accordingly, the frequency variation due to the AC Stark effect can be suppressed, and the atomic oscillator 1 having high frequency stability can be provided.

(2) According to the embodiment, the wavelength selection device 120 includes the temperature control device 120b to change the wavelength range selected by the etalon 120a. Thus, the shift of the wavelength selection characteristic (wavelength range selected by the etalon) of the etalon 120a due to a manufacture error or environmental change (heat, light, etc.) can be corrected. Accordingly, the wavelength selection apparatus 120 can accurately select and emit the first sideband wave W1 and the second sideband wave W2 from the first light L1.

(3) According to the embodiment, the wavelength selection characteristic of the etalon 120a depends on the length of the etalon 120a. In a manufacture process of the etalon 120a, the length of the etalon 120a is difficult to accurately determine, and a manufacture error can occur in the etalon 120a. Even in such a case, since the wavelength selection device 120 includes the temperature control device 120b, the shift of the wavelength selection characteristic due to the manufacture error can be corrected.

(4) According to the embodiment, the temperature control device 120b can change the wavelength selection characteristic of the etalon 120a by the thermooptical effect caused by the heat generated by the temperature control device 120b. By this, the wavelength selection characteristic of the etalon 120a can be easily controlled. Further, the temperature control device 120b is constructed to include the heating element (resistor). Accordingly, the structure of the wavelength selection device 120 can be made simple.

(5) According to the embodiment, in the optical module 2, the semiconductor laser 110 can be made the surface emitting laser. As compared with the end-face emitting laser, in the surface emitting laser, since a current for obtaining a gain is small, power consumption can be reduced.

(6) According to the embodiment, the optical element 170 to cause the first light L1 emitted from the semiconductor laser 110 to be incident on the etalon 120*a* is provided. By this, the first light L1 generated by the semiconductor laser 110 can be efficiently guided to the etalon 120*a*.

(7) According to the embodiment, the atomic oscillator 1 includes the optical module 2 having high frequency stability. Accordingly, the atomic oscillator 1 can raise frequency stability.

Although the embodiments of the invention re described in detail as described above, it would be easily understood for a person skilled in the art that many modifications can be made without substantially departing from the novel matter and effects of the invention. Accordingly, all of such modified examples are included in the scope of the invention.

The entire disclosure of Japanese Patent Application No. 2011-064031, filed Mar. 23, 2011 is expressly incorporated by reference herein.

What is claimed is:

1. An optical module for an atomic oscillator using a quantum interference effect, comprising:
   a light source adapted to emit light including a fundamental wave having a center wavelength, and sideband waves of the fundamental wave;
   a wavelength selection section receiving the light from the light source, and adapted to transmit the sideband waves and to reduce the fundamental wave out of the light input;
   a gas cell encapsulating an alkali metal gas, and irradiated with light transmitted through the wavelength selection section; and
   a light detection section adapted to detect an intensity of light transmitted through the gas cell,
   wherein the wavelength selection section includes:
   an etalon, and
   a temperature control section adapted to control temperature of the etalon.

2. The optical module for an atomic oscillator according to claim 1, wherein,
   the temperature control section includes a resistive element, and controls the temperature of the etalon by controlling a current to be applied to the resistive element.

3. The optical module for an atomic oscillator according to claim 1, wherein,
   the light source is a surface emitting laser.

4. The optical module for an atomic oscillator according to claim 1, further comprising:
   an optical element adapted to make the light emitted from the light source enter the etalon.

5. An atomic oscillator comprising:
   an optical module for an atomic oscillator according to claim 4; and
   a frequency control circuit.

6. An atomic oscillator comprising:
   an optical module for an atomic oscillator according to claim 1; and
   a frequency control circuit.

7. An atomic oscillator comprising:
   an optical module for an atomic oscillator according to claim 2; and
   a frequency control circuit.

8. An atomic oscillator comprising:
   an optical module for an atomic oscillator according to claim 3; and
   a frequency control circuit.

* * * * *